United States Patent [19]
Lee

[11] Patent Number: 5,696,456
[45] Date of Patent: Dec. 9, 1997

[54] ENHANCED LOW VOLTAGE TTL INTERFACE

[75] Inventor: Terry R. Lee, Boise, Id.

[73] Assignee: Micron Technology, Inc., Boise, Id.

[21] Appl. No.: 600,638

[22] Filed: Feb. 29, 1996

[51] Int. Cl.$^6$ .................. H03K 19/0944; H03K 19/017
[52] U.S. Cl. .................. 326/70; 326/17; 326/23; 326/80
[58] Field of Search .................. 326/22–24, 68, 326/80–81, 83, 70–71, 115, 119, 17; 327/77, 80, 88–89

[56] References Cited

U.S. PATENT DOCUMENTS

| | | | |
|---|---|---|---|
| 4,937,476 | 6/1990 | Bazes | 326/71 |
| 5,019,728 | 5/1991 | Sanwo et al. | 326/24 |
| 5,019,729 | 5/1991 | Kimura et al. | 326/71 |
| 5,118,968 | 6/1992 | Douglas et al. | 307/362 |
| 5,172,016 | 12/1992 | Dobberpuhl | 326/71 |
| 5,408,146 | 4/1995 | Nguyen et al. | 326/86 |
| 5,596,291 | 1/1997 | Runas | 327/77 |

Primary Examiner—Edward P. Westin
Assistant Examiner—Jon Santamauro
Attorney, Agent, or Firm—Schwegman, Lundberg, Woessner & Kluth, P.A.

[57] ABSTRACT

A differential transistor pair is used for a Low Voltage Transistor-Transistor Logic (LVTTL) input buffer to provide an input buffer for a modified and enhanced LVTTL specification. The differential input buffer accurately detects high and low voltages which are respectively lower and higher than existing specified LVTTL voltage levels, yet provides output voltages that are representative of intended logic levels. This provides the ability to use the improved input buffer with existing drivers at higher frequencies where the voltage swing provided by the existing drivers do not produce as large a voltage swing as that required by existing LVTTL specifications.

2 Claims, 2 Drawing Sheets

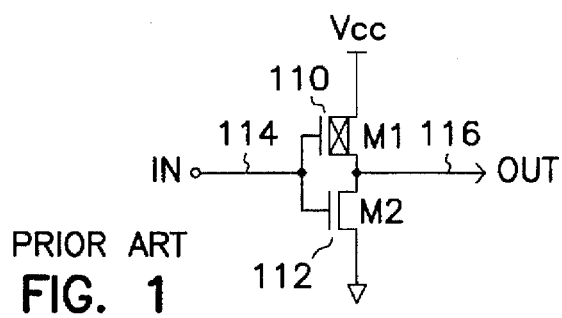
PRIOR ART
FIG. 1
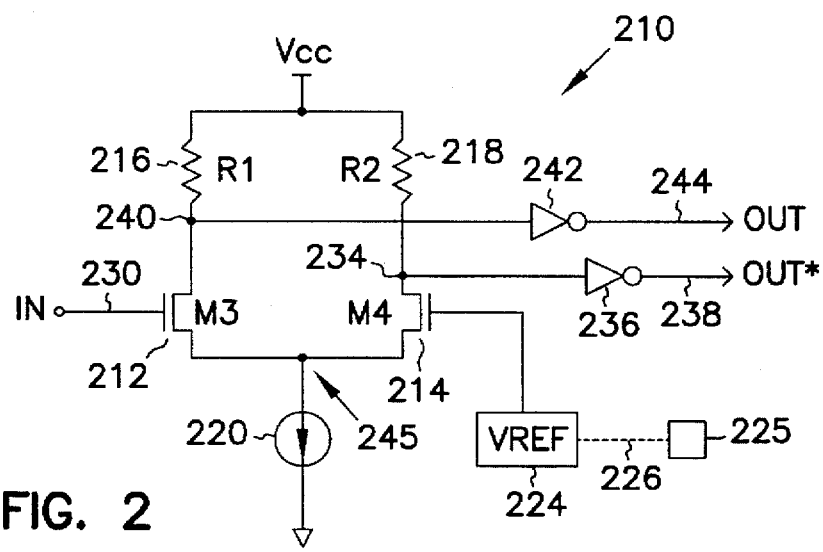
FIG. 2
| | TABLE 1 | |
|---|---|---|
| | LVTTL | ENHANCED LVTTL |
| $V_{OH}$ MIN | 2.4V | 2.4V |
| $V_{OL}$ MAX | 0.4V | 0.4V |
| $V_{IH}$ MIN | 2.0V | 1.6V |
| $V_{IL}$ MAX | 0.8V | 1.2V |
| *$V_{OH}$ MIN AC | N/A | 1.8V |
| *$V_{OL}$ MAX AC | N/A | 1.0V |
| * AC SPECIFICATIONS ARE FOR OPERATING SPEED OF GREATER THAN 80MHz | | |
FIG. 3

ENHANCED LOW VOLTAGE TTL INTERFACE

FIELD OF THE INVENTION

The present invention relates to signaling interfaces for TTL logic, and in particular to an improved low voltage TTL interface.

BACKGROUND OF THE INVENTION

Integrated circuits are designed to recognize certain voltage levels as representative of boolean logic values. For instance, a high voltage may be recognized as a 1, while a low voltage may be recognized as a 0. There are multiple specifications for different types of circuitry, each of which may recognize different levels of voltages as 1's and 0's. Such specifications are very important to ensure that devices manufactured by different manufacturers will work with each other. One such specification, Low Voltage Transistor-Transistor Logic (LVTTL) is commonly used to define voltage levels recognizable by memory devices for personal computers. Dynamic Random Access Memory (DRAM) devices provide the main memory for personal computers, and accept and provide data at LVTTL levels. Input buffers or receivers in DRAMs that receive these levels have to be able to recognize whether a voltage is intended to be a high or a low voltage.

The LVTTL specification dictates that all voltages higher than Voltage Input High min(VIH min=2.0 volts) be interpreted as a high voltage, and that all voltages lower than Voltage Input Low max (VIL max=0.8 volts) be interpreted as a low voltage. In addition, it requires that output drivers of devices output voltages of specified values. Voltage Output High min (VOH min=2.4 volts) is the minimum voltage that should be output when a high logic signal is to be transmitted. Voltage Output Low max (VOL max=0.4 volts) is the maximum voltage that should be output when a low logic signal is to be transmitted. As can be seen, this provides a 0.4 volt noise margin (the differences between high and low input and output voltages) for connecting two LVTTL compliant devices.

The LVTTL specification was derived from original TTL specifications which were developed over 20 years ago. The specification provides for a 0.8 volt differential between VIL and VIH. Device speeds of today are much greater than when the specification was first developed. Personal computer processor speeds were measured in kilohertz, whereas today they are measured in hundreds of megahertz, with no apparent slowdown in the rate of increasing speed. There are several drawbacks to using LVTTL specified voltage swings in today's higher speed systems. One problem is that the large signal swings of 2.0 volts induces significant amounts of electromagnetic interference (EMI) radiation. The width of today's memory busses, 64 bits wide, greatly increases the amount of EMI emitted. There are strict controls on such radiation, and it is getting harder to meet limits imposed by government regulations.

As the operating speeds of personal computers increase, the power dissipation increases due to the large voltage transitions between high and low. The AC component of the signal switching power dissipation is approximately equal to $cv^2f$, where c is the capacitance in farads, v is the voltage swing in volts, and f is the frequency of the switching in hertz. When originally developed, the AC component of power dissipation was not significant for TTL circuitry, since the typical operating frequencies were much lower than today, and the dc component was high, since bipolar transistors were used. For a given physical environment, the capacitance is fixed, and therefore, the only way to reduce the AC component of power dissipation at increasing operating frequencies is to reduce the signal swing. The larger swings were necessary to provide adequate noise margin for VIH and VIL specifications.

Another drawback of using large signal swings for higher frequency operations is the increased output drive current requirements. For a driver to charge and discharge the capacitance, i=cdv/dt, where i is the current in amps, c is the capacitance in farads, and dv/dt is the voltage slew rate in volts per second. Dv is 2v for LVTTL, and dt must get smaller as the operating frequency increases. As the operating frequency goes up, the current capability of a driver must increase. This results in larger output buffer transistor sizes, which represent a larger capacitive load to a pre-driver circuit. These larger capacitive loads force a much more difficult, high frequency pre-driver circuit design in order to drive larger currents.

Current input buffer circuits comprise in their simplest form, a series stacked p and n field effect transistor (FET) pair, M1 at 110 and M2 at 112 as shown in prior art FIG. 1. An input 114 is applied to the gates of both transistors, and only one transistor conducts in steady state, resulting in a very low DC current draw. The output is taken between the transistors at 116. The input threshold, or the input voltage at which the output of the buffer transitions to the opposite logic state, is determined by the ratio of the output impedance of M1 and M2 at a given input voltage, V1. At a given input and output voltage, the output impedance of the transistor will be a function of the physical device width, device length, the threshold voltage of the device, channel doping concentration, and gate oxide thickness. Since n and p FETs are formed using different masks, their nominal FET characteristics may change with respect to the each other for different fabrication lots. Further, the impedances have sensitivity to the drain-to-source voltage, VDS, and the bulk-to-source voltage, VBS. Given the topography of the circuit, the p-channel transistor, M1, and the n-channel transistor, M2 will experience different values of VDS and VBS for a given input voltage. Also, since the M1 and M2 transistors are of different types, changes in any of the aforementioned physical characteristics of the p-channel device will not necessarily track changes in the n-channel characteristics. Therefore, the input threshold voltage of the input buffer will vary significantly with process parameter variation and temperature. This variance requires a larger differential for VIH/VIL to guarantee proper operation.

The input buffer of FIG. 1 was selected as the standard type of input buffer for LVTTL implementation because of its low power usage in steady state conditions. Twenty years ago, with lower frequency personal computers, this was a valid design point. With increasing processor speeds, and hence a greater AC power dissipation component, the assumption is no longer valid. In a typical application, such as a memory to logic interface, the output signal becomes bandwidth limited at about 100 Mhz. It fails to output an adequate VOH min or VOL max above that frequency. This has been acceptable to date, since memory bus frequencies in personal computer range from 33 to 66 Mhz. However, there is a desire to increase the frequency of the memory bus to over 100 Mhz in order to improve system performance. Therefore, there is a need to increase the frequency response of the memory to logic interface while maintaining backwards compatibility with existing devices.

There is a need for a new signaling interface which is compatible with existing memory devices in personal computers. Consumers have many millions of dollars invested in their DRAM memory for their personal computers. Clearly, any type of new signaling technology should be backwards compatible with existing memory and memory controllers in order to preserve that investment.

Several alternative arrangements have been proposed, such as Small Swing Transistor Logic (SSTL), High Speed Transistor Logic (HSTL), and Gunning Transistor Logic (GTL). While these may solve some of the problems, they are not backward compatible with existing LVTTL devices, or they may require hundreds of additional components in a personal computer to implement. They do not protect the considerable investment of consumers. These new incompatible standards will not work properly in existing applications. Further, where the consumer upgrades their personal computer memory five years into the future, they will still require devices which are LVTTL compatible. This requirement would necessitate two different device types, an LVTTL compatible and a non-compatible, higher speed device. There is a need for a device which provides both higher speeds and is LVTTL compatible. There is also a concern over power consumption and EMI radiation in high speed computers.

SUMMARY OF THE INVENTION

A differential transistor pair is used for a Low Voltage Transistor-Transistor Logic (LVTTL) input buffer to provide an input buffer for a modified and enhanced LVTTL specification. The differential input buffer accurately detects high and low voltages which are respectively lower and higher than existing specified LVTTL voltage levels, making it backwards compatible with existing LVTTL compliant devices. The use of a higher low input voltage maximum (VIL max) and lower high input voltage minimum (VIH min), reduces the voltage swing required to transition between logic levels represented by the low and high input voltages. By reducing the voltage swing, AC power dissipation, as well as electromagnetic interference (EMI) radiation is reduced. In addition, the improved input buffer accurately responds to higher frequencies than prior LVTTL input buffers, for a small signal input. Differential transistor pairs were known more than twenty years ago, but were not considered for use in LVTTL circuits due to their higher DC power consumption characteristics. They also required more complex circuitry in the form of a reference voltage to operate. Now, with increased input frequencies, the differential transistor input buffer provides significant unexpected advantages such as backwards compatibility with existing LVTTL compliant circuitry. They also allow a reduction in voltage level swings, which actually reduces the total power consumption and EMI radiation in high frequency applications.

At frequencies higher than that typically encountered by current LVTTL specifications, the input voltage swing requirements of the new input buffer are reduced. This provides the ability to respond to input frequencies beyond common personal computer maximum memory bus speeds of 66 Mhz, and to reduce power consumption and EMI radiation. The input buffer may be used with current LVTTL output drivers which become bandwidth limited with deteriorating voltage swings at higher frequencies near 100 Mhz. Since the input buffer still responds to LVTTL output voltages at lower frequencies, it is fully compatible with current uses of LVTTL compliant devices.

The input buffer uses a reference voltage of approximately 1.4 volts as one input to compare against the input from other devices. VIL max is then increased from 0.8 volts in the current spec to 1.2 volts, and VIH min is decreased from 2.0 volts to 1.6 volts, resulting in a total voltage swing of only 0.4 volts in the enhanced spec as compared to 1.2 volts in the current specification. Since the transistors in the differential input buffer are both of the same doping, such as n-channel field effect transistors (FET), and preferably formed close together on the same semiconductor die, their threshold voltage input characteristics closely match over process and temperature variations. This allows a reduction in the voltage swing required for accurate detection of intended voltage levels.

At frequencies higher than a predetermined frequency in the range of 66 Mhz to 100 Mhz, and about up to 150 Mhz, the output voltage of the output driver may be below the LVTTL specified voltages, but they will provide satisfactory input voltages for devices built according to the enhanced LVTTL spec. Adequate noise margin is maintained while substantially improving the maximum operating frequency, power dissipation, and EMI radiation. This permits memory busses to be built having much higher bandwidth, increasing the overall performance available in personal computers.

BRIEF DESCRIPTION OF THE DRAWINGS

FIG. 1 is schematic diagram of a prior art Low Voltage Transistor-Transistor Logic (LVTTL) stacked transistor input and output buffer.

FIG. 2 is a schematic diagram of a differential transistor pair enhanced LVTTL input buffer constructed in accordance with the present invention.

FIG. 3 is a table comparing current LVTTL voltage levels with enhanced LVTTL voltage levels.

DESCRIPTION OF THE EMBODIMENTS

Figure 4:
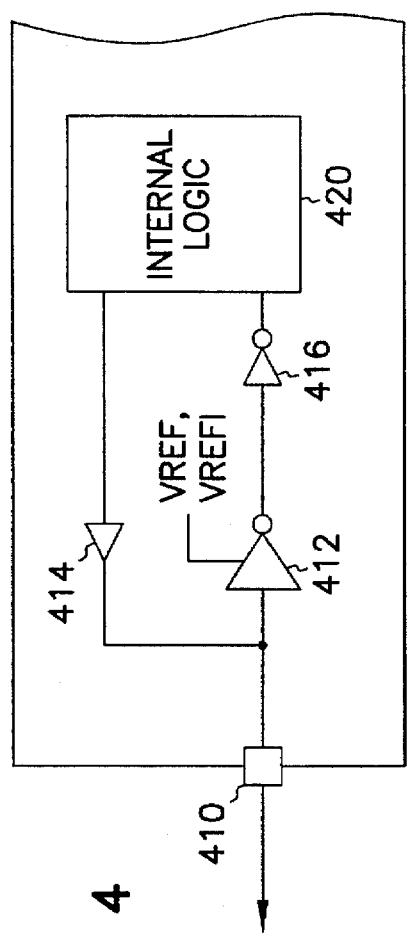
FIG. 4 is a simplified block schematic diagram of a semiconductor DRAM chip with input and output buffers.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

An enhanced Low Voltage Transistor-Transistor Logic (LVTTL) input buffer is indicated generally at 210 in FIG. 2. The input buffer 210 is a conventional differential pair comprising two field effect transistors M3 at 212 and M4 at 214 having drains coupled to Vcc through respective loads comprising resistors R1 at 216 and R2 at 218. In one embodiment, Vcc is approximately 3.3 volts. Both transistors are isolated gate field effect transistors having gates, sources and drains as is commonly known in the art and having a high differential gain in relation to its common-mode gain providing a high common-mode rejection ratio. Other types of field effect transistors or similar differential amplifier devices providing suitable characteristics will also suffice. The loads for the transistors may also be a simple p-channel current mirror as is well known in the art. The sources of the transistors are coupled to a DC current source 220 such as a further transistor having a gate coupled to a reference voltage such as 1.2 volts, and a source coupled to common to provide a constant DC current. Other current sources will be apparent to those skilled in the art. The current source may also be switched off to reduce current consumption in a standby mode.

A reference voltage indicated at 224 is coupled to the gate of M4 to provide a reference potential for comparison with an input voltage. In one embodiment, VREF 224 comprises a voltage divider on chip. Changes in VREF track changes in the supply voltage with such a reference circuit. In further embodiments, a band gap reference, or other suitable circuit is employed to generate VREF. An alternative source for a precision reference voltage is provided off chip as indicated by chip pad 225 which is shown coupled by broken line 226 to VREF 224. Line 226 is shown in broken form only to indicate that the precision reference which has a low impedance may be applied to overdrive the reference circuit 224 which has a moderate impedance. When the external reference voltage is not present, circuit 224 provides VREF.

An input terminal 230 is coupled to the gate of M3 and serves as an input for other devices generating voltages, such as the output from memory chips, or memory control circuitry which transmit LVTTL signals each other to transfer data. An output is provided at node 234, located between R2 and M4, which in one embodiment is inverted by an inverter 236 coupled to node 234. Inverter 236 provides the inverse logic level of an output signal, OUT* at 238 at substantially full rail voltages. Alternatively, the output signal is taken from a node 240 coupled between R1 and M3 and inverted by an inverter 242 to provide a direct logic level output signal, OUT at 244. The voltage at node 240 varies between 3 volts and 0.55 volts in this embodiment. The output signal 244 is approximately at the power supply rails, Vcc and common which is suitable for use by other circuitry formed on the same semiconductor die. In an alternative embodiment, the nodes 234 and 240 are coupled to a latch or helper flip-flop circuit at 242 to provide hysteresis latching and further amplification.

In operation, the difference between the input voltage 230 and the reference voltage 224 determines the voltage levels at nodes 234 and 240. As is well known in the art, a suitable reference voltage VREF, such as 1.4 volts, will result in M4 being in saturation, and hence conductive between drain and source. This creates a voltage drop across resistor R2 when node 230 is well below VREF. When the input voltage is above the threshold voltage of M3 plus the voltage at node 245, M3 conducts current between drain and source. The voltage at node 245 was previously affected by the current through current source 220 and by the voltages VREF and the threshold voltage of M4. This creates a voltage drop across resistor R1, and steers current from current source 220 toward R1 and away from R2. M3 conducts and raises the voltage at node 245 causing M4 to turn off. With high gain transistors, the output signal, OUT will be at a low or a high voltage within a slight variation of input voltage about VREF. This provides the ability of the differential amplifier pair to detect intended high and low voltages at its input with relatively small differences between VIL and VIH.

With the use of the differential amplifier pair 210, the difference between an intended high and low input voltage, or voltage swing, does not need to be as great as with current LVTTL specifications. The current LVTTL specification dictates that all voltages higher than Voltage Input High min(VIH min=2.0 volts) be interpreted as a high voltage, and that all voltages lower than Voltage Input Low max (VIL max =0.8 volts) be interpreted as a low voltage. In addition, it requires that an output driver output voltages of specified values. Voltage Output High min (VOH min=2.4 volts) is the minimum voltage that should be output when a logic 1 is desired. Voltage Output Low max (VOL max=0.4 volts) is the maximum voltage that should be output when a logic 0 is desired. As can be seen, this provides a 0.4 volt noise margin (the differences between high and low input and output voltages) for connecting two LVTTL compliant devices.

The LVTTL specification was derived from original TTL specifications which were developed over 20 years ago. The specification provides for a 0.8 volt differential between VIL and VIH. With the use of a differential amplifier input buffer as described above, the input voltages need not change or swing as much to be correctly detected as intended high and low voltages. The use of a higher low input voltage maximum (VIL max) and lower high input voltage minimum (VIH min), reduces the voltage swing required to transition between logic levels represented by the low and high input voltages. Using a reference voltage VREF of approximately 1.4 volts as one input to the differential amplifier input buffer 210 to compare against the input from other devices, the lower maximum input voltage VIL max is then increased from 0.8 volts in the current spec to 1.2 volts, and VIH min is decreased from 2.0 volts to 1.6 volts, resulting in a total voltage swing of only 0.4 volts in the enhanced spec as compared to 1.2 volts in the current specification.

With the differential pair topology, changes in the threshold voltages of M3 and M4 track well with variations in process parameters, voltage and temperature, unlike the stacked transistor topology shown in FIG. 1. The transistors are formed using the same masks, so there is no variation in device parameters introduced by independent masks. In addition, since they are formed close together, there is less chance of variation in layer thicknesses or doping concentrations which vary over relatively large distances. For these reasons, less voltage margin is required to ensure a reliable detection of intended high and low signals. This allows a reduction in the input voltage swing required for accurate detection of intended voltage levels.

Voltage specifications for both the current LVTTL levels, and the new enhanced LVTTL levels for the differential amplifier input buffer 210 described herein are shown in FIG. 3 in table form. At frequencies higher than a predetermined level, such as 80 Mhz and about up to 150 Mhz, the output voltage of the input buffer may be below the LVTTL specified voltages. Since the operating speeds of the current personal computer memory busses only go as high as 66 Mhz, LVTTL output drivers do not need to output voltages above that frequency in the range specified by current LVTTL levels. Therefore, to extend the frequency range of such output drivers, the high output voltage minimum for such frequencies may be reduced to 1.8 volts, and the low output voltage maximum may be increased to 1.0 volts. This allows the standard LVTTL output drivers to become bandwidth limited and drive reduced voltage swings at high frequencies. Since the input voltage detection of input buffer 210 is not significantly affected at such higher frequencies, enhanced LVTTL input buffers will work well with existing LVTTL output drivers. Since the swing in output voltage required at higher frequencies is reduced, adequate noise margin is maintained while substantially improving the maximum operating frequency, power dissipation, and EMI radiation characteristics of such circuits. This permits memory busses to be built having much higher bandwidth, increasing the overall performance available in personal computers while preserving customer investment in current memory.

In FIG. 4, a device formed on a semiconductor chip is partially shown with a device pad 410 for communicating signals to and from other chips. Pad 410 is one of many such pads included on the semiconductor chip. Device pad 410 is coupled to an input buffer 412 formed as described with respect to input buffer 210. The device pad 410 is also coupled to an output driver 414 which may be of the type shown in FIG. 1. Signals received at device pad 410 are detected and amplified by the input buffer 412 and further inverted and amplified by an inverter 416 in the same manner as described with respect to FIG. 2. Inverter 416 is coupled to internal logic 420 which in one embodiment comprises the internal logic of memory devices or memory logic controllers. Internal logic 420 is also coupled to output driver 414 for transferring signals to other chips via device pad 410. There are multiple sets of drivers and input buffers, corresponding to the number of device pads.

Figure 5:
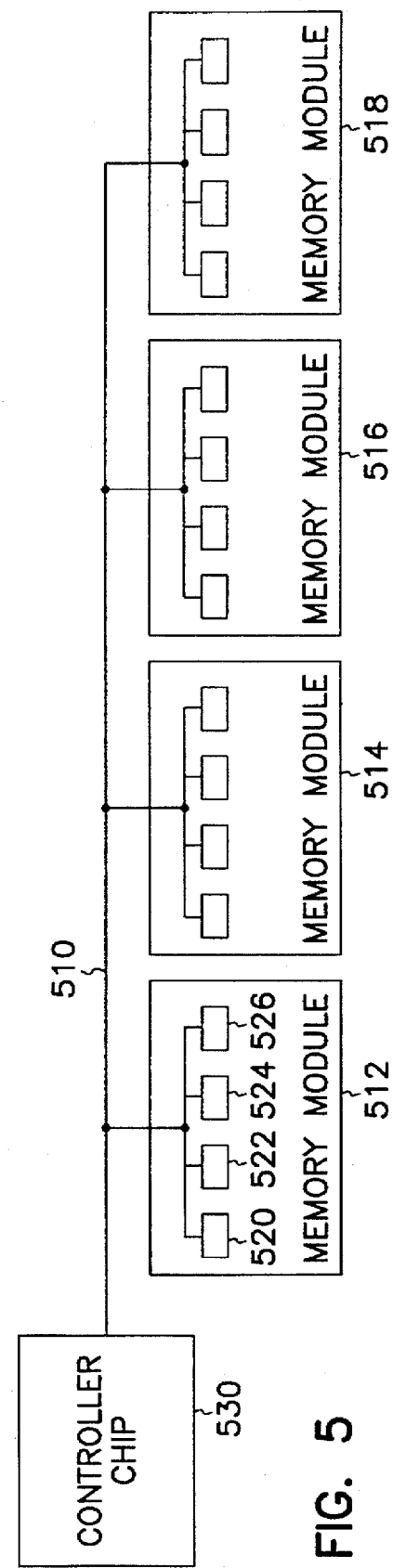
FIG. 5 is a block diagram illustrating the use of input and output buffers to couple memory modules and a memory controller chip to a memory bus.

In FIG. 5, which depicts a memory subsystem, the input buffer/driver combination is shown as used to couple two chips together via a memory bus 510, such as a common 64 bit memory bus used in personal computers. A plurality of memory modules, such as single in line memory modules (SIMMs) 512, 514, 516 and 518 each contain a plurality of memory chips as indicated at 520, 522, 524 and 526 in SIMM 512. In one embodiment, the memory chips are dynamic random access memories (DRAMs). Other memory chips may also be used. Each of the memory chips contains device pads, internal logic in the form of memory address lines and memory cells, and driver/buffer combinations as shown in FIG. 4. A controller chip 530 is also coupled to memory bus 510 and contains device pads corresponding to the number of bits in the memory bus, internal logic and driver/buffer combinations as shown in FIG. 4 to communicate with the memory modules via memory bus 510 using LVTTL signal levels. This combination of devices is a simple representation of a memory subsystem for a personal computer.

Should a user decide to add more memory to their personal computer, and they have room for more SIMMs, they can add SIMMs built according to the present invention because they will still operate at slower speeds. Alternatively, personal computer makers can increase the speed of the memory bus to rates higher than will work with current LVTTL devices, and use only SIMMs built according to the present invention. Either way, memory makers need only stock the new SIMMs to satisfy requirements for memory devices. The user thus has protected their investment in equipment while gradually migrating to higher speed memories.

In addition, the manufacturer of the memory devices did not need to stock older slower parts. Rather than duplicating costly plant and equipment to manufacture newer faster parts as well as older slower parts, the manufacturer simply needed to manufacture newer faster parts in accordance with the present invention. They may be used in either a fast or slow environment, with the old version of LVTTL, or the new, enhanced version of LVTTL.

It should be noted that in many field effect transistors, the source and drain are essentially interchangeable, and interconnections specified herein should not be interpreted as solely limited to those described. In addition, while some transistors were described as an n-channel transistor, it is recognized by those skilled in the art that a p-channel transistor may also be used.

It should be noted that the voltage values specified for the enhanced LVTTL specification may be varied without departing from the scope of the invention. The differential between VIH and VIL is reduced, but maintained about the same centerpoint of approximately 1.4 volts. Also, VOH and VOL are maintained compatible at lower frequencies. The use of the differential pair input receiver/buffer allows the use of a smaller VIH/VIL differential voltage at various frequencies.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An interface for Low Voltage Transistor-Transistor Logic (LVTTL) compliant devices comprising:

a first transistor having an input for coupling to a reference voltage which is approximately halfway between a low input voltage maximum and a high input voltage minimum, wherein the reference voltage is provided by an on-chip circuit which is coupled to an I/O pad for receiving an optional reference voltage having a lower impedance than the on-chip circuit;

a second transistor having an output coupled to an output of the first transistor, and having an input for coupling to an input voltage;

a pair of loads respectively coupled to the first and second transistors; and a current source coupled to the coupled outputs of the first and second transistors, wherein output voltages taken between the transistors and their loads are representative of intended logic levels for smaller input voltage swings than are required by LVTTL specifications.

2. An interface for detecting intended voltage levels representative of logical ones and zeros in accordance with Low Voltage Transistor-Transistor Logic (LVTTL) specifications and providing output voltage levels representative of intended logic ones and zeros comprising:

a differential amplifier input buffer having a first input coupled to a reference voltage provided by an on-chip circuit which is coupled to an I/O pad for receiving an optional reference voltage having a lower impedance than the on-chip circuit, a second input coupled to an input voltage and an output, such that an output voltage is representative of intended logical ones and zeros in response to a swing in voltage at the second input substantially less than LVTTL specified voltage levels.

* * * * *